(12) United States Patent
Pathak

(10) Patent No.: US 6,359,477 B1
(45) Date of Patent: Mar. 19, 2002

(54) LOW POWER DRIVER DESIGN

(75) Inventor: Rajesh Pathak, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/586,049

(22) Filed: Jun. 2, 2000

Related U.S. Application Data

(60) Provisional application No. 60/137,599, filed on Jun. 3, 1999.

(51) Int. Cl.[7] .............................. H03B 1/00; H03K 3/00
(52) U.S. Cl. ..................... 327/112; 327/269; 327/271; 327/108; 326/86; 326/26; 326/83
(58) Field of Search ................................ 327/112, 437, 327/333, 108, 427, 263, 269, 271, 272, 219, 225; 326/26–28, 83, 86, 87; 365/189.05

(56) References Cited

U.S. PATENT DOCUMENTS

| | | | | |
|---|---|---|---|---|
| 4,890,016 A | * | 12/1989 | Tanaka et al. ................. | 326/27 |
| 5,097,148 A | * | 3/1992 | Gabara ......................... | 326/86 |
| 5,313,579 A | * | 5/1994 | Chao ........................... | 395/200 |
| 5,473,271 A | * | 12/1995 | Little et al. .................. | 327/108 |
| 5,519,344 A | * | 5/1996 | Proebsting .................... | 327/108 |
| 5,973,509 A | * | 10/1999 | Taniguchi et al. ............. | 326/86 |
| 5,986,463 A | * | 11/1999 | Takiguchi ..................... | 326/27 |
| 6,160,742 A | * | 12/2000 | Chung et al. .......... | 365/189.05 |

* cited by examiner

*Primary Examiner*—Terry D. Cunningham
*Assistant Examiner*—Long Nguyen
(74) *Attorney, Agent, or Firm*—Robert D. Marshall, Jr.; W. James Brady, III; Frederick J. Telecky, Jr.

(57) ABSTRACT

A buffer circuit includes a chain of a plurality of inverters. A first inverter has transistors with a size to present a first predetermined capacitive loading at its input. This is selected with regard to the target operating frequency of the driving circuit (typically a flip-flop) and the transistor size selected for this driving circuit. Each inverter has transistors with a size a predetermined size factor greater than the transistors of a preceding inverter. The first inverter has transistors the size factor larger than the driving circuit. The size factor is preferably 3. The number of inverters in the chain is selected so that the last inverter has transistors with a size to drive its output capacitive loading with a maximum rise and fall time corresponding to the target frequency. If the number of inverters is even, then the buffer input is connected to a normal output of the driving circuit. If the number of inverters is odd, then the buffer input is connected to an inverted output of the driving circuit.

1 Claim, 3 Drawing Sheets

LOW POWER DRIVER DESIGN

CLAIM OF PRIORITY

This application claims priority under 35 U.S.C. 119(e)(1) from U.S. Provisional Patent Application No. 60/137,599 filed Jun. 3, 1999.

TECHNICAL FIELD OF THE INVENTION

The technical field of this invention is integrated circuit design and especially low power driver design.

BACKGROUND OF THE INVENTION

Control logic consumes a large percentage of power in today's microprocessors and microcontrollers. A significant amount of this control logic power is consumed by the storage elements. These are typically edge-triggered D flip-flops. Simulations conducted on a microcontroller family estimates that a 30% reduction in flip-flop power consumption translates to about 6% power reduction for the entire integrated circuit. This is the greatest power reduction of all hardware techniques identified. Gated clock methodology translates to only less than 2% saving of the total integrated circuit power. Therefore it is essential that the library of design cells for low power application specific integrated circuits (ASIC's) include low power versions of the flip-flops.

SUMMARY OF THE INVENTION

A buffer circuit includes a chain of a plurality of inverters. A first inverter has transistors with a size to present a first predetermined capacitive loading at its input. This is selected with regard to the target operating frequency of the driving circuit (typically a flip-flop) and the transistor size selected for this driving circuit. Each inverter has transistors with a size a predetermined size factor greater than the transistors of a preceding inverter. The first inverter has transistors the size factor larger than the driving circuit. The size factor is preferably 3. The number of inverters in the chain is selected so that the last inverter has transistors with a size to drive its output capacitive loading with a maximum rise and fall time corresponding to the target frequency. If the number of inverters is even, then the buffer input is connected to a normal output of the driving circuit. If the number of inverters is odd, then the buffer input is connected to an inverted output of the driving circuit.

BRIEF DESCRIPTION OF THE DRAWINGS

These and other aspects of this invention are illustrated in the drawings, in which.

DETAILED DESCRIPTION OF PREFERRED EMBODIMENTS

This invention reduces power consumption of the library cells significantly at the expense of gate delay or area or both. In the low power design methodology power consumption takes priority over gate delay. This is the opposite of conventional design where performance as measured by gate delay is the first priority. Low power design is especially critical to battery powered portable systems. In battery power portable systems low power consumption in electronics translates into increased operation between battery replacement or recharging or reduced battery weight for the same battery life.

Control logic consumes a large percentage of power in today's microprocessors and microcontrollers. A significant amount of this control logic power is consumed by the storage elements. These are typically edge-triggered D flip-flops. Simulations conducted on a microcontroller family estimates that a 30% reduction in flip-flop power consumption translates to about 6% power reduction for the entire integrated circuit. This is the greatest power reduction of all hardware techniques identified. Gated clock methodology translates to only less than 2% saving of the total integrated circuit power. Therefore it is essential that the library of design cells for low power application specific integrated circuits (ASIC's) include low power versions of the flip-flops. A number of prior art techniques are described below.

Figure 1:
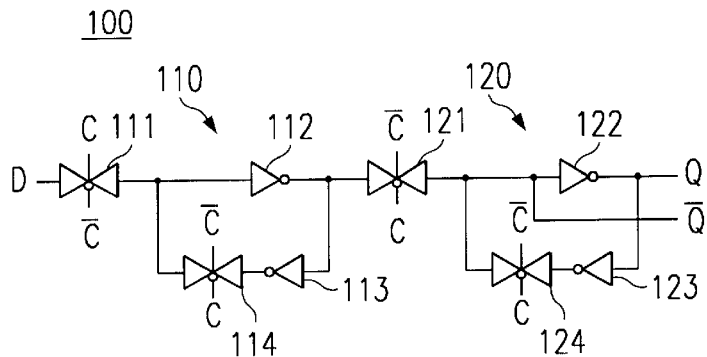
FIG. 1 illustrates in schematic diagram form a common D flip flop circuit of the prior art.

FIG. 1 illustrates a negative edge-triggered D flip-flop 100 of the prior art. This circuit 100 consists of a master latch 110 and a slave latch 120. Master latch 110 includes an input transmission gate 111, a first inverter 112, a second inverter 113 and a feedback transmission gate 114. The input signal D is supplied to input transmission gate 111 of master latch 110. The output of the master latch supplies the input of the slave latch. The slave latch likewise includes an input transmission gate 121, a first inverter 122, a second inverter 123 and a feedback transmission gate 124. Note that the input transmission gate 111 of master latch 110 is clocked in the opposite phase than the input transmission gate 121 of slave latch 120. Thus these transmission gates conduct on opposite phase of the clock signal C. Inverter 122 of slave latch 120 generates the circuit output signal Q. An inverse Q output can be taken from the input of inverter 122. This circuit illustrated in FIG. 1 can be constructed with 16 MOSFETs. The speed of this regular D flip-flop is limited by a two-gate delay after the clock signal C transitions from logic 1 to 0. The advantage of this D flip-flop design is that it involves minimum design risk.

Figure 2:
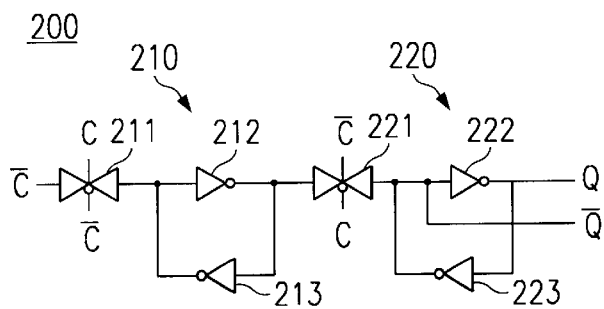
FIG. 2 illustrates in schematic diagram form a common low area D flip flop circuit of the prior art.

A common approach in the prior art to reduce area of the regular D flip-flop 100 is to remove the two feedback transmission gates 114 and 124. FIG. 2 illustrates this low-area D flip-flop (LADFF) circuit 200. Low-area D flip-flop circuit 200 can be constructed using 12 MOSFETS, 25% fewer transistors than the D flip-flop circuit 100. This reduces the integrated circuit area needed to construct the D flip-flop. The low-area D flip-flop circuit 200 has the disadvantage of consuming more power. The strength of feedback inverters 213 and 223 can be weakened to minimize the short-circuit power dissipation due to voltage contention. This has the disadvantage of increasing the rise and fall times, thus decreasing the maximum frequency of operation. Design simulations indicate that the low-area D flip-flop circuit 200 consumes more total power and is slower than that of the regular D flip-flop circuit 100.

Figure 3:
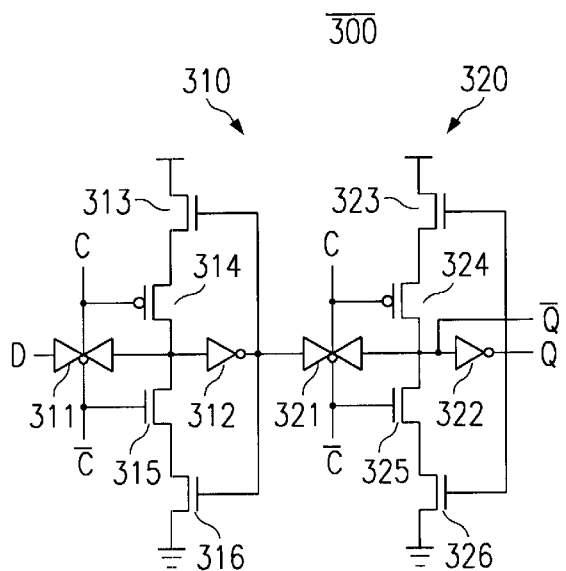
FIG. 3 illustrates in schematic diagram form a common low power D flip flop circuit of the prior art.

FIG. 3 illustrates another approach in the prior art to optimize the D flip-flop for power dissipation is to replace the inverter 113 and transmission gate 114 in the feedback path of the master latch 110 with a tri-state inverter. Another tri-state inverter replaces the inverter 123 and the transmission gate 124 in the feedback path of the slave latch. FIG. 3 illustrates this low-power D flip-flop circuit 300. The tri-state inverter in the master latch 310 includes P-type MOSFETs 313 and 314, and N-type MOSFETs 315 and 316. The tri-state inverter in the slave latch 320 includes P-type MOSFETs 323 and 324, and N-type MOSFETs 325 and 326. Low-power D flip-flop circuit 300 can be constructed with 16 MOSFETS, the same number as the regular D flip-flop circuit 100. Only one of MOSFETs 314 or 315 is conductive at one time depending upon the polarity of the clock signal C. Similarly, only one of MOSFETs 324 or 325 is conductive at one time. This avoids short-circuit power dissipation in the feedback path. Design simulations indicate that this yields only a small reduction in total power and a slightly slower speed when compared to the regular D flip-flop circuit 100. Circuit simulations indicate that low-power D flip-flop circuit 300 is comparable to the regular D flip-flop circuit 100 in area and energy efficiency.

Figure 4:
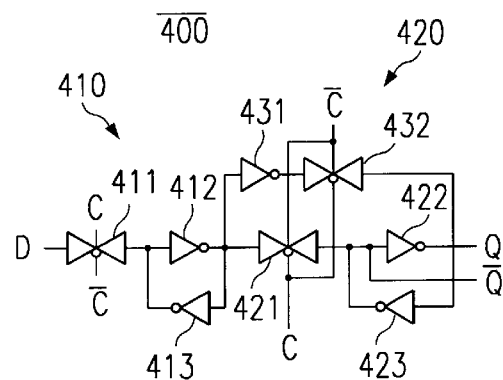
FIG. 4 illustrates in schematic diagram form a push pull D flip flop circuit of the prior art.

FIG. 4 illustrates a further alternative circuit. To optimize for speed, an inverter 431 and a transmission gate 432 are added between outputs of master latch 410 and slave latch 420. This accomplishes a push-pull effect at slave latch 420. This adds four MOSFETs, but reduces the clock-to-output (C-to-Q) delay from two gates in the regular D flip-flop circuit 100 to one gate. To offset the four added MOSFETs in the push-pull circuit, the two transmission gates 114 and 124 in feedback paths of the regular D flip-flop circuit 100 are eliminated in a manner similar to the low-area D flip-flop circuit 200. This yields a circuit employing 16 MOSFETs, the same as the regular D flip-flop circuit 100. Compared to the regular D flip-flop circuit 100, circuit simulations indicate that this push-pull D flip-flop circuit 400 is 31% faster but employs 22% more power. This increase in speed more than offsets the increase in power, yielding a circuit having a higher energy efficiency than the regular D flip-flop circuit 100.

The switching power consumed by a circuit is proportional to the effective capacitance and the switching rate. For application specific integrated circuit cells the primary contributor to cell capacitance is the CMOS gate capacitance. Each CMOS transistor must move charge to and from the gate of succeeding CMOS transistors. The gate capacitance is directly proportional to the transistor size. Therefore reducing the transistor size should reduce switching power. This is especially true for circuits which have high switching activity such as clock distribution nets. However for deep submicron circuits, circuits formed with transistor feature sizes less than one micron, reduction of transistor size may not reduce the power consumed. Reduction of the transistor size tends to lengthen the voltage rise and fall times. This is because the reduced transistor size reduces the drive current available for charge transport. This increase in voltage rise and fall times thus tends to increase the proportion of short circuit power dissipation in the circuit. Accordingly, in some instances reduction of transistor size does not reduce circuit power consumption.

This is shown in Table 1. Table 1 shows the comparative average and peak currents of two flip-flop circuits which toggle at a rate of 20% of the clock frequency. The second circuit (Reduced Size) is constructed of transistors about one third smaller than the original circuit (Original ORG). The two circuits have same drive strength. Reducing the switching capacitance by reducing the transistor size reduces the peak current but increases the average current and the power dissipation by 15%. This is directly attributed to the increase in short circuit power dissipation because rise/fall times increased proportionately to the reduction in transistor size.

TABLE 1

| Toggle D at 20% of clock frequency | Average current μA | Peak current μA |
| --- | --- | --- |
| Original ORG | 20.2 | 801 |
| Reduced Size | 23 | 588 |

This invention is a design technique for building low power versions of library cells in deep sub-micron technology. The technique presents a "pseudo-load" to the flip-flop which is orders of magnitude less than the real load to the logic portion of the cell. Therefore the transistors in the logic portion of the cell are can be reduced in size without a corresponding increase in rise/fall times on the nets. For these flip-flops the short-circuit power dissipation remains unchanged but switching power is reduced due to a decrease in the gate capacitances. The net effect is a decease in the total power dissipation. Alternatively, one can reduce short-circuit power dissipation without resizing the transistors using an appropriate pseudo-load. This maintains the switching power constant because the rise/fall times are improved when driving the pseudo-load. The penalty for this better power efficiency is the increase in delay due to the inverter chain.

Figure 5:
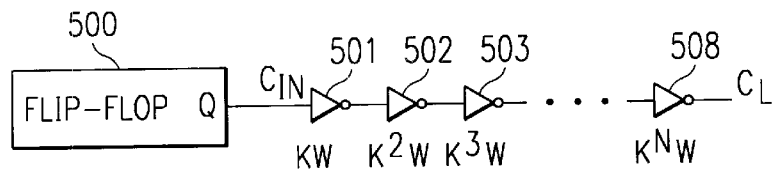
FIG. 5 illustrates the inverter chain buffer of a first embodiment of this invention.

FIG. 5 illustrates the inverter chain buffer of this invention. Flip-flop 500 represents the logic output driving the inverter chain buffer. In this example the Q output of flip-flop 500 is buffered. The output transistors of flip-flop 500 are constructed of a predetermined channel width W, selected to provide the desired gate capacitance loading $C_{IN}$ to prior circuits within flip-flop 500. First inverter 501 is constructed using transistors having a channel a predetermined factor k greater than the channel width of the output circuit of flip-flop 500. Thus inverter 501 includes transistors having a channel width of kW, as illustrated in FIG. 5. The output of inverter 501 drives the input of inverter 502. Inverter 502 includes transistors having a channel width factor k greater than the channel width of inverter 501. Thus inverter 502 includes transistors having a channel width of $k^2W$, as illustrated in FIG. 5. Inverter 503 having an input from the output of inverter 502 includes transistors having a channel width factor k greater than the channel width of inverter 502, thus having a channel width of $k^3W$, as illustrated in FIG. 5. Each succeeding inverter has a channel width a factor of k greater than the preceding inverter to Nth inverter 508 having a transistors of channel width of $k^NW$, as illustrated in FIG. 5. This transistor channel width is sufficient to drive an output capacitive loading CL with a desired rise and fall time. The number of inverters in the chain is selected based upon the input capacitive loading $C_{IN}$, the output capacitive loading $C_L$ and the size factor k. This enables the flip-flop 500 to have transistors with channel widths to drive input capacitive loading $C_{IN}$ with a selected rise and fall time while permitting the inverter chain buffer to drive the output capacitive loading $C_L$ without degradation of the rise and fall times.

It should be apparent to one skilled in the art if the number of inverters in the inverter chain is odd then the logic state at the output can be maintained by taking the inverter chain input from a $\overline{Q}$ output of flip-flop 500. An inverted $\overline{Q}$ output can be obtained from the input of inverter 122 of D flip flop 100 illustrated in FIG. 1, the input of inverter 222 of low area D flip flop 200 of FIG. 2, the input of inverter 322 of low power tri-state D flip flop 300 of FIG. 3 and the input of inverter 422 of push pull D flip flop 400 illustrated in FIG. 4.

The value of the input capacitance $C_{IN}$ presented to the driving device can be made as small as desired by choosing an appropriate number of inverters in the inverter chain. For each stage the input capacitive load is a factor of k less than the output capacitive load for the same rise and fall times. The rise and fall times have the following ratio to the capacitive load:

$$T_{R/F} = R * C/w$$

where: $T_{R/F}$ is the rise and fall times of the circuit; R is a proportionality constant; C is the capacitive load presented; and w is the channel width of the transistor driving the load. Accordingly, for any circuit that sees its load decreased by a factor of k, the channel width of the transistor driving this load can be correspondingly reduced by a factor of k without a degradation in rise/fall time.

The size factor k is selected to provide balance between the load presented to the preceding inverter in the chain and the drive capacity. Inverters with large transistors can drive large capacitive loads due to the large conductance of their channels. However, large transistors also have large gates which present a large input capacitive load. The size factor k of the width of transistors in between stages in the inverter chain is preferably 3. This ratio reduces the extra delay due to the inverter chain to a bare minimum. Experimental results show that the power-delay product of the newly designed cells are consistently superior to the low power D flip-flop 100 illustrated in FIG. 1.

Figure 6:
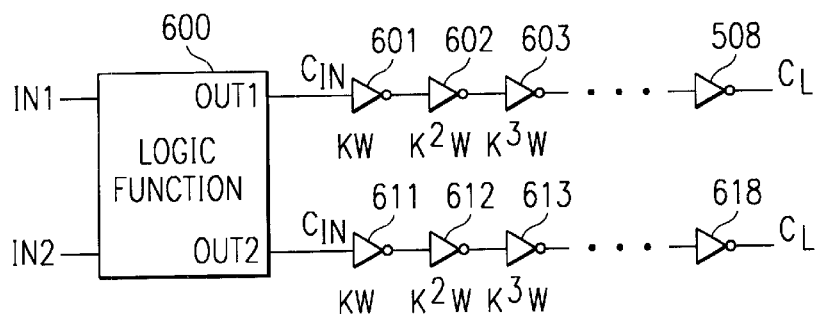
FIG. 6 illustrates the inverter chain buffers of a second embodiment of this invention.

FIG. 6 illustrates an alternative use of this invention. Logic function 600 includes at least two inputs In1 and In2 and at least two outputs Out1 and Out2. A first inverter chain consisting of inverters 601, 602, 603 through 608 is coupled to the first output Out1. As shown in FIG. 5, each inverter in this first inverter chain is constructed of transistors having a channel width a factor of k larger than the preceding inverter. A second similarly constructed inverter chain consisting of inverters 611, 612, 613 through 618 is coupled to the second output Out2. Each of these inverter chains provides a suitably reduced capacitive load to the corresponding output Out1 and Out2. Therefore the channel widths of the transistors of the drive circuits for outputs Out1 and Out2 may be sized to produce a desired rise and fall time into this reduced load. Alternatively, the channel widths may be retained with a consequent decrease in rise and fall times. Such a reduction in switching times would permit higher frequency operation.

Figure 7:
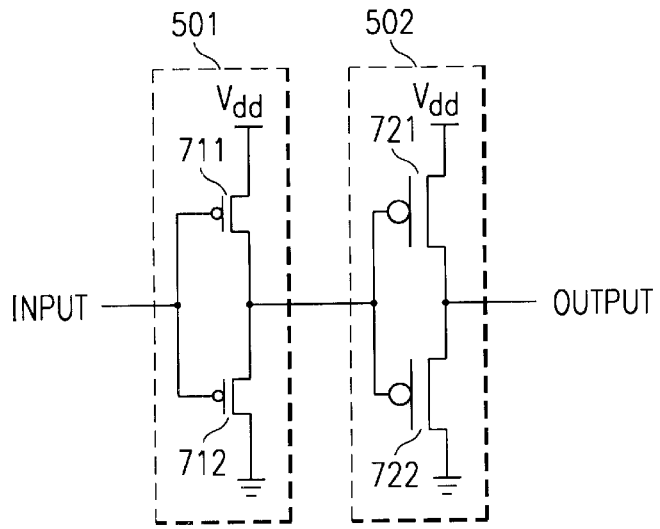
FIG. 7 illustrates the construction of a representative inverter from the inverter chains of FIGS. 5 and 6.

FIG. 7 illustrates an example of the construction of inverters 501 and 502 illustrated in FIG. 5. Inverter 501 is of conventional design and includes P-channel transistor 711 and N-channel transistor 712. Each of these transistors has a channel width of W1. Inverter 502 similarly includes P-channel transistor 721 and N-channel transistor 722. Each of these transistors has a larger channel width of W2. In accordance with this invention W2=k*W1.

This invention exploits the idea that circuits with the highest switching rates should have the lowest capacitive loading. This tends to reduce the power consumed in charge transport. However, it is not helpful to merely reduce transistor sizes to reduce the gate capacitance. The reduced transistor size tends to increase the circuit rise and fall times. In the inverter circuits illustrated in FIG. 7 an increase in rise and fall times increases the proportion of the cycle when both transistors are conducting. This causes increased short circuit power consumption. In this invention capacitive loads can be redistributed so that circuits with the lowest switching rates experience the greatest capacitive loading. This frees integrated circuit area which can be devoted to the inverter chain of the present invention permitting reduced transistor size on the fastest switching circuits while maintaining suitable short rise and fall times. A net reduction in power consumption results because circuits experiencing the highest capacitive loading are have the least switching rate.

Figure 9:
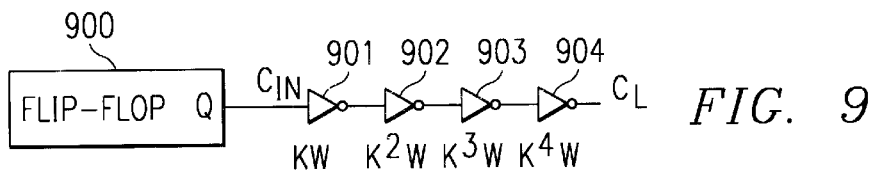
FIG. 9 illustrates an example of an inverter chain of an even number of inverters connected to a normal flip-flop output.
Figure 10:
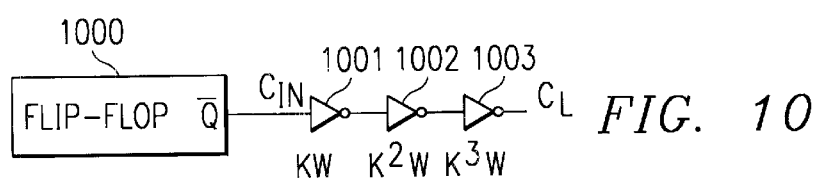
FIG. 10 illustrates an example of an inverter chain of an odd number of inverters connected to an inverted flip-flop output.
Figure 8:
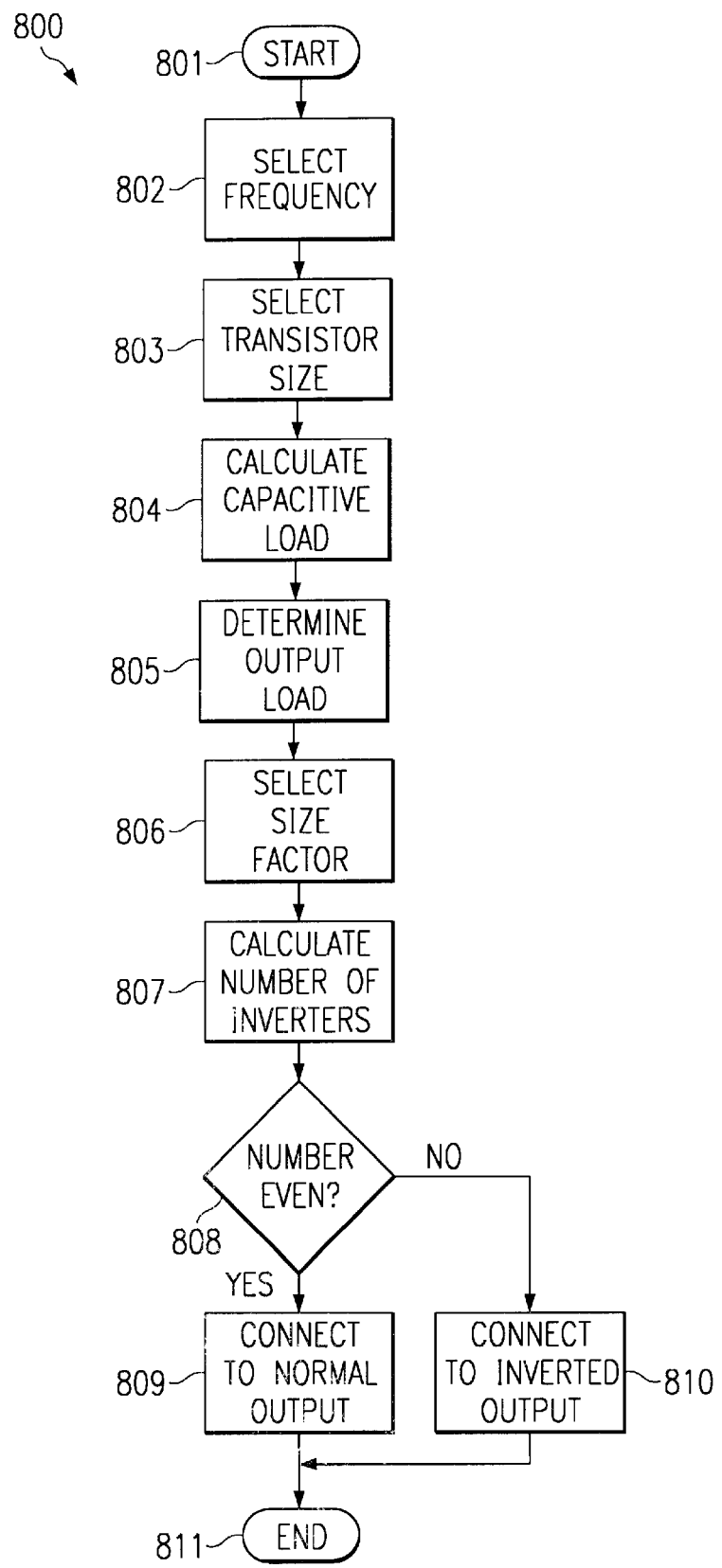
FIG. 8 illustrates the steps in the design method of this invention.

FIG. 8 illustrates the steps in buffer design method 800 of this invention. The design method begins at start block 801. Initially the target frequency of operation is selected (processing block 802). Note that the frequency of operation implies a maximum rise and fall time. Next, the transistor size of the circuit is selected (processing block 803). These selections enable calculation of the maximum capacitive load that these circuits can drive (processing block 804). Note that the frequency selection determined the longest rise and fall times permitted and the transistor size selection determines the channel width. Thus the maximum capacitive loading permitted can be determined from the equation $T_{R/F} = R * C/w$ above. Next the output load is determined (processing block 805). The number and type circuits driven by the buffer determine this capacitive load Next the size factor k is determined (processing block 806). As previously described, the size factor k is preferably 3, however other factors are feasible. Next, the number of inverters needed to transform from a capacitive loading of $C_{IN}$ to $C_L$ is computed (processing block 807) Note that the ratio of the initial capacitive loading $C_{IN}$ to the output capacitive loading $C_L$ is proportional to $k^N$, where N is the number of inverters. The relationship permits calculation of the number of inverters needed. The method determines if this calculated number of inverters is even (decision block 808). If so, then the input of the inverter chain is connected to a normal output of the driving circuit (processing block 809). This is illustrated in FIG. 9 where the normal output of flip-flop 900 drives a chain of four inverters 901, 902, 903 and 904. If not, then the input of the inverter chain is connected to an inverted output of the driving circuit (processing block 810). This is illustrated in FIG. 10 where an inverted output of flip-flop 1000 drives a chain of three inverters 1001, 1002 and 1003. These normal and inverted outputs correspond to the Q and the $\overline{Q}$ outputs of the flip-flops illustrated in FIGS. 1 to 4. The method is then complete (end block 811).

What is claimed is:

1. A buffer circuit comprising:
   a plurality of more than two inverters each having an input and an output, said input of a first inverter being said buffer circuit input, each inverter except a last inverter having its output connected to said input of a succeeding inverter, said output of said last inverter being said buffer output;

said first inverter having transistors with a size to present a first predetermined capacitive loading at its input;

each inverter other than said first inverter having transistors with a predetermined size factor greater than said transistors of a preceding inverter;

said last inverter having transistors with a size to drive a second predetermined capacitive loading greater than said first predetermined capacitive loading with a preselected maximum rise and fall time;

a flip-flop circuit having at least one output, said flip-flip circuit having transistors with a size to drive said first predetermined capacitive loading with a preselected flip-flop maximum rise and fall time, said flip-flop circuit having a first output and a second output, said second output producing a signal which is an inverse of said first output; and wherein said input of said first inverter is connected to said first output of said flip-flop if there is an even number of said plurality of inverters and said input of said first inverter is connected to said second output of said flip-flop if there is an odd number of said plurality of inverters.

* * * * *